(12) United States Patent
Tanaka

(10) Patent No.: US 6,698,000 B2
(45) Date of Patent: Feb. 24, 2004

(54) SEMICONDUCTOR PROCESS PARAMETER DETERMINING METHOD, SEMICONDUCTOR PROCESS PARAMETER DETERMINING SYSTEM, AND SEMICONDUCTOR PROCESS PARAMETER DETERMINING PROGRAM

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 103 days.

(21) Appl. No.: 09/986,711

(22) Filed: Nov. 9, 2001

(65) Prior Publication Data

US 2002/0152059 A1 Oct. 17, 2002

(30) Foreign Application Priority Data

Apr. 16, 2001 (JP) ........................................ 2001-117266

(51) Int. Cl.[7] .............................................. G06F 17/50
(52) U.S. Cl. .............................................. 716/2; 703/13
(58) Field of Search .......................... 703/13–15; 716/1, 716/2, 5, 10, 8, 6

(56) References Cited

U.S. PATENT DOCUMENTS

| | | | | | |
|---|---|---|---|---|---|
| 5,581,475 A | * | 12/1996 | Majors | ........................ | 716/10 |
| 5,706,477 A | * | 1/1998 | Goto | ........................... | 703/14 |
| 5,790,436 A | * | 8/1998 | Chen et al. | ..................... | 716/5 |
| 5,825,673 A | * | 10/1998 | Watanabe | .................... | 703/14 |
| 5,946,482 A | * | 8/1999 | Barford et al. | ............... | 703/14 |
| 6,028,994 A | * | 2/2000 | Peng et al. | .................. | 703/15 |
| 6,253,358 B1 | * | 6/2001 | Takahashi | ...................... | 716/6 |
| 6,330,526 B1 | * | 12/2001 | Yasuda | .......................... | 703/2 |
| 6,340,729 B1 | * | 1/2002 | Bonardi et al. | ............... | 526/83 |
| 6,539,534 B1 | * | 3/2003 | Bennett | ....................... | 716/17 |

FOREIGN PATENT DOCUMENTS

| JP | 10-178099 | 6/1998 |
|---|---|---|
| JP | 11-238655 | 8/1999 |

OTHER PUBLICATIONS

Mehmet, Aktuma, et al., 1998, ACM, pp. 57–64.*

* cited by examiner

Primary Examiner—Stacy A Whitmore
(74) Attorney, Agent, or Firm—Burns, Doane, Swecker & Mathis, LLP

(57) ABSTRACT

There is provided a semiconductor process determining method comprising: Step ST1 of inputting an input parameter from a input part; Step ST2 of obtaining the delay time of a certain circuit by means of simulation on a gate level by letting the output parameter of each wiring layer be a variable; Step ST3 of judging whether or not the simulation is completed; Step ST4 of extracting the output parameter of each wiring layer giving the shortest delay time; and Step ST5 of outputting the extracted output parameter of each wiring layer in a display part.

8 Claims, 14 Drawing Sheets

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| BETWEEN-DIFFERENT-LAYERS OVERLAPPING PROBABILITY | |
| THE NUMBER OF WIRING LAYER | |
| CELL LIBRARY | |

FIG.3

| INPUT PARAMETER | OUTPUT PARAMETER |
|---|---|
| GATE SCALE<br><br>IN-THE-SAME-LAYER ADJACENT PROBABILITY<br><br>BETWEEN-DIFFERENT-LAYERS OVERLAPPING PROBABILITY<br><br>THE NUMBER OF WIRING LAYER<br><br>CELL LIBRARY | WIRING WIDTH<br><br>WIRE SPACING |

FIG.4

| INPUT PARAMETER | OUTPUT PARAMETER |
|---|---|
| GATE SCALE<br><br>IN-THE-SAME-LAYER ADJACENT PROBABILITY<br><br>BETWEEN-DIFFERENT-LAYERS OVERLAPPING PROBABILITY<br><br>THE NUMBER OF WIRING LAYER<br><br>TRANSISTOR LIBRARY | WIRING WIDTH<br><br>WIRE SPACING |

FIG.5

| INPUT PARAMETER | OUTPUT PARAMETER |
|---|---|
| GATE SCALE<br><br>IN-THE-SAME-LAYER ADJACENT PROBABILITY<br><br>BETWEEN-DIFFERENT-LAYERS OVERLAPPING PROBABILITY<br><br>THE NUMBER OF WIRING LAYER<br><br>CELL LIBRARY | WIRING WIDTH<br><br>WIRE SPACING<br><br>CONDUCTOR THICKNESS |

FIG.6

| INPUT PARAMETER | OUTPUT PARAMETER |
|---|---|
| GATE SCALE<br><br>IN-THE-SAME-LAYER ADJACENT PROBABILITY<br><br>BETWEEN-DIFFERENT-LAYERS OVERLAPPING PROBABILITY<br><br>THE NUMBER OF WIRING LAYER<br><br>CELL LIBRARY | WIRING WIDTH<br><br>WIRE SPACING<br><br>CONDUCTOR THICKNESS<br><br>THE RELATIVE DIELECTRIC CONSTANT OF DIELECTRIC<br><br>THE FILM THICKNESS OF DIELECTRIC |

FIG.7

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| BETWEEN-DIFFERENT-LAYERS OVERLAPPING PROBABILITY | CONDUCTOR THICKNESS |
| | THE RELATIVE DIELECTRIC CONSTANT OF DIELECTRIC |
| THE NUMBER OF WIRING LAYER | THE FILM THICKNESS OF DIELECTRIC |
| CELL LIBRARY | THE OPTIMUM WIRING MATERIAL |
| A PLURALITY OF WIRING MATERIALS | |

FIG.8

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| BETWEEN-DIFFERENT-LAYERS OVERLAPPING PROBABILITY | CONDUCTOR THICKNESS |
| | THE RELATIVE DIELECTRIC CONSTANT OF DIELECTRIC |
| THE NUMBER OF WIRING LAYER | THE FILM THICKNESS OF DIELECTRIC |
| CELL LIBRARY | THE OPTIMUM WIRING MATERIAL |
| A PLURALITY OF WIRING MATERIALS | VIA DIAMETER |
| A PLURALITY OF VIA MATERIALS | VIA SHAPE |
| | THE OPTIMUM VIA MATERIAL |

FIG.9

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| | CONDUCTOR THICKNESS |
| BETWEEN-DIFFERENT-LAYERS OVERLAPPING PROBABILITY | THE RELATIVE DIELECTRIC CONSTANT OF DIELECTRIC |
| THE NUMBER OF WIRING LAYER | THE FILM THICKNESS OF DIELECTRIC |
| CELL LIBRARY | THE OPTIMUM WIRING MATERIAL |
| A PLURALITY OF WIRING MATERIALS | VIA DIAMETER |
| A PLURALITY OF VIA MATERIALS | VIA SHAPE |
| OPERATION FREQUENCY | THE OPTIMUM VIA MATERIAL |

FIG.10

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| | CONDUCTOR THICKNESS |
| BETWEEN-DIFFERENT-LAYERS OVERLAPPING PROBABILITY | THE RELATIVE DIELECTRIC CONSTANT OF DIELECTRIC |
| THE NUMBER OF WIRING LAYER | THE FILM THICKNESS OF DIELECTRIC |
| CELL LIBRARY | THE OPTIMUM WIRING MATERIAL |
| A PLURALITY OF WIRING MATERIALS | VIA DIAMETER |
| A PLURALITY OF VIA MATERIALS | VIA SHAPE |
| OPERATION FREQUENCY | THE OPTIMUM VIA MATERIAL |
| CROSS TALK NOISE TOLERANCE | |

FIG.11

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| | CONDUCTOR THICKNESS |
| BETWEEN-DIFFERENT-LAYERS OVERLAPPING PROBABILITY | THE RELATIVE DIELECTRIC CONSTANT OF DIELECTRIC |
| THE NUMBER OF WIRING LAYER | THE FILM THICKNESS OF DIELECTRIC |
| CELL LIBRARY | |
| A PLURALITY OF WIRING MATERIALS | THE OPTIMUM WIRING MATERIAL |
| A PLURALITY OF VIA MATERIALS | VIA DIAMETER |
| | VIA SHAPE |
| OPERATION FREQUENCY | THE OPTIMUM VIA MATERIAL |
| CROSS TALK NOISE TOLERANCE | |
| POWER CONSUMPTION TOLERANCE | |
| TRANSITION DELAY TOLERANCE | |

FIG.12

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| BETWEEN-DIFFERENT-LAYERS OVERLAPPING PROBABILITY | CONDUCTOR THICKNESS |
| | THE RELATIVE DIELECTRIC CONSTANT OF DIELECTRIC |
| THE MAXIMUM ALLOWABLE NUMBER OF WIRING LAYER | THE FILM THICKNESS OF DIELECTRIC |
| CELL LIBRARY | THE OPTIMUM WIRING MATERIAL |
| A PLURALITY OF WIRING MATERIALS | VIA DIAMETER |
| A PLURALITY OF VIA MATERIALS | VIA SHAPE |
| OPERATION FREQUENCY | THE OPTIMUM VIA MATERIAL |
| CROSS TALK NOISE TOLERANCE | THE OPTIMUM NUMBER OF WIRING LAYER |
| POWER CONSUMPTION TOLERANCE | |
| TRANSITION DELAY TOLERANCE | |

FIG.14

| INPUT PARAMETER | OUTPUT PARAMETER |
|---|---|
| GATE SCALE | WIRING WIDTH |
| IN-THE-SAME-LAYER ADJACENT PROBABILITY | WIRE SPACING |
| BETWEEN-DIFFERENT-LAYERS OVERLAPPING PROBABILITY | CONDUCTOR THICKNESS |
| THE MAXIMUM ALLOWABLE NUMBER OF WIRING LAYER | THE RELATIVE DIELECTRIC CONSTANT OF DIELECTRIC |
| CELL LIBRARY | THE FILM THICKNESS OF DIELECTRIC |
| A PLURALITY OF WIRING MATERIALS | THE OPTIMUM WIRING MATERIAL |
| A PLURALITY OF VIA MATERIALS | VIA DIAMETER |
| OPERATION FREQUENCY | VIA SHAPE |
| CROSS TALK NOISE TOLERANCE | THE OPTIMUM VIA MATERIAL |
| POWER CONSUMPTION TOLERANCE | THE OPTIMUM NUMBER OF WIRING LAYER |
| TRANSITION DELAY TOLERANCE | |
| LCR CONVERSION | |

FIG.16

| INPUT PARAMETER | OUTPUT PARAMETER |
|---|---|
| NETLIST | WIRING WIDTH |
| FLOORPLAN INFORMATION | WIRE SPACING |
| THE MAXIMUM ALLOWABLE NUMBER OF WIRING LAYER | CONDUCTOR THICKNESS |
| | THE RELATIVE DIELECTRIC CONSTANT OF DIELECTRIC |
| CELL LIBRARY | THE FILM THICKNESS OF DIELECTRIC |
| OPERATION FREQUENCY | |
| CROSS TALK NOISE TOLERANCE | THE OPTIMUM WIRING MATERIAL |
| POWER CONSUMPTION TOLERANCE | VIA DIAMETER |
| | VIA SHAPE |
| TRANSITION DELAY TOLERANCE | THE OPTIMUM VIA MATERIAL |
| | THE OPTIMUM NUMBER OF WIRING LAYER |

SEMICONDUCTOR PROCESS PARAMETER DETERMINING METHOD, SEMICONDUCTOR PROCESS PARAMETER DETERMINING SYSTEM, AND SEMICONDUCTOR PROCESS PARAMETER DETERMINING PROGRAM

BACKGROUND OF THE INVENTION

1. Field of the Invention

The present invention relates to a semiconductor process parameter determining method, a semiconductor process parameter determining system, and a semiconductor process parameter determining program used for determining a process parameter in a semiconductor device manufacturing method.

2. Description of Related Art

FIG. 18 is a flow chart showing an example of conventional semiconductor process parameter determining methods. Here, the process parameters determined by the conventional semiconductor process parameter determining method shown in FIG. 18 are two types of parameters, a wiring width and a wire spacing in a semiconductor device.

First of all, in Step ST101, TEG (Test Element Group) for evaluation is designed by letting the wiring width be a parameter. For instance, five types of TEGs in which the wiring widths are 1 $\mu$m, 2 $\mu$m, 4 $\mu$m, 7 $\mu$m, and 10 $\mu$m are designed. Subsequently, in Step ST102, the designed TEGs are manufactured by use of a semiconductor process technology. Then, in Step ST103, the optimum wiring width is determined by evaluating the five types of manufactured TEGs.

For instance, if 4 $\mu$m is the optimum wiring width, in Step ST104 TEGs for evaluation are designated by fixing the wiring width to 4 $\mu$m, and letting the wire spacing be a parameter. For example, five types of TEGs in which the wire spacings are 1 $\mu$m, 2 $\mu$m, 3 $\mu$m, 4 $\mu$m, and 5 $\mu$m are designed. Then, in Step ST105 the designed TEGs are manufactured by use of a semiconductor process technology. After that, in Step ST106, the optimum wire spacing is determined by evaluating the five types of manufactured TEGs.

Since the conventional semiconductor process parameter determining method is constructed as mentioned above, a plurality of TEGs should be designed, manufactured, and evaluated in order to determine one process parameter. As a result, since much time is spent in determining the process parameter, there is a drawback that the efficiency is extremely low and the cost used until the determination of the process parameter is extremely high.

SUMMARY OF THE INVENTION

The present invention has been accomplished to solve the above-mentioned drawback. An object of the present invention is to provide a semiconductor process parameter determining method, a semiconductor process parameter determining system, and a semiconductor process parameter determining program that promptly determine the optimum process parameter, and hold down the cost thereof.

According to a first aspect of the present invention, there is provided a semiconductor process parameter determining method, comprising the steps of: inputting a first process parameter as an input parameter; obtaining a predetermined circuit characteristic by performing a simulation on a gate level and/or a transistor level by use of the input parameter with a second process parameter of each wiring layer constructing a semiconductor device as a variable; determining whether said simulation is completed or not; extracting the second process parameter for each wiring layer obtaining a desired circuit characteristic; and outputting the extracted, second process parameter for each wiring layer.

Here, the input parameter may include a tolerance, which is selected from an operation frequency, a cross talk noise tolerance, a power consumption tolerance, a transition delay tolerance, and the maximum allowable number of wiring layers.

The method may further comprise a step of converting the tolerance into any one of inductance, capacitance and resistance.

When the input parameter includes a tolerance and the first process parameter includes floorplan information and a netlist, the method may comprise a step of format-converting the floorplan information and netlist while executing the placement and routing based on the tolerance.

According to a second aspect of the present invention, there is provided a semiconductor process parameter determining system, comprising: a terminal including an input means for inputting a first process parameter and/or a tolerance, an output means for outputting a received, second process parameter for each wiring layer constructing a semiconductor device, and a communicating means capable of sending and receiving the first process parameter, the tolerance, and the second process parameter through a communication line; and a semiconductor process parameter determining apparatus that obtains a predetermined circuit characteristic by executing a simulation based on the first process parameter and/or the tolerance received from the terminal, and sends the second process parameter for each wiring layer performing a desired circuit characteristic based on the results of the simulation to the terminal.

Here, the semiconductor process parameter determining apparatus may charge each terminal for use according to information amount and a type of information where the information is sent and received from/to each terminal.

According to a third aspect of the present invention, there is provided a semiconductor process parameter determining program capable of executing by computer a semiconductor process parameter determining method comprising the steps of: inputting a first process parameter and/or a tolerance as an input parameter; obtaining a predetermined circuit characteristic by means of simulation on a gate level and/or a transistor level by use of the input parameter with a second process parameter for each wiring layer constructing a semiconductor device as a variable; determining whether the simulation is completed or not; extracting the second process parameter for each wiring layer accomplishing a desired circuit characteristic; and outputting the extracted, second process parameter for each wiring layer.

Here, the first process parameter may be selected from gate scale, an in-the-same-layer wiring adjacent probability, a between-different-layers wiring overlapping probability, the number of wiring layer, library information, a plurality of wiring materials, a plurality of via materials, floorplan information, and a netlist.

The tolerance may be selected from an operation frequency, a cross talk noise tolerance, a power consumption tolerance, a transition delay tolerance, the maximum allowable number of wiring layer.

The second process parameter may be selected from a wiring width, a wire spacing, and a conductor thickness of the wiring layer, a relative dielectric constant and a film thickness of a dielectric, a plurality of wiring materials, a plurality of via materials, and a plurality of numbers of wiring layer.

BRIEF DESCRIPTION OF THE DRAWINGS

FIG. 3 is an explanatory diagram showing the input parameter and the output parameter in the semiconductor process parameter according to Embodiment 1 of the present invention;

FIG. 4 is an explanatory diagram showing the input parameter and the output parameter in the semiconductor process parameter according to Embodiment 2 of the present invention;

FIG. 5 is an explanatory diagram showing the input parameter and the output parameter in the semiconductor process parameter according to Embodiment 3 of the present invention;

FIG. 6 is an explanatory diagram showing the input parameter and the output parameter in the semiconductor process parameter according to Embodiment 4 of the present invention;

FIG. 7 is an explanatory diagram showing the input parameter and the output parameter in the semiconductor process parameter according to Embodiment 5 of the present invention;

FIG. 8 is an explanatory diagram showing the input parameter and the output parameter in the semiconductor process parameter according to Embodiment 6 of the present invention;

FIG. 9 is an explanatory diagram showing the input parameter and the output parameter in the semiconductor process parameter according to Embodiment 7 of the present invention;

FIG. 10 is an explanatory diagram showing the input parameter and the output parameter in the semiconductor process parameter according to Embodiment 8 of the present invention;

FIG. 11 is an explanatory diagram showing the input parameter and the output parameter in the semiconductor process parameter according to Embodiment 9 of the present invention;

FIG. 12 is an explanatory diagram showing the input parameter and the output parameter in the semiconductor process parameter according to Embodiment 10 of the present invention;

FIG. 14 is an explanatory diagram showing the input parameter and the output parameter in the semiconductor process parameter according to Embodiment 11 of the present invention;

FIG. 16 is an explanatory diagram showing the input parameter and the output parameter in the semiconductor process parameter according to Embodiment 12 of the present invention;

DETAILED DESCRIPTION OF THE PREFERRED EMBODIMENTS

An embodiment of the present invention will next be described.

Embodiment 1

Figure 1:
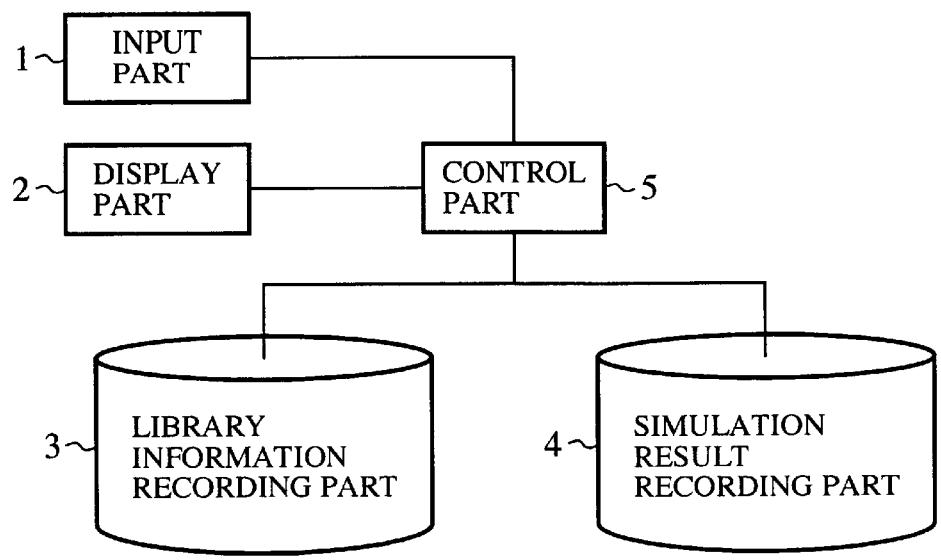
FIG. 1 is a block diagram showing the configuration of the semiconductor process parameter determining apparatus according to Embodiment 1 of the present invention.

FIG. 1 is a block diagram showing the configuration of the semiconductor process parameter determining apparatus for executing the semiconductor process parameter determining method according to Embodiment 1 of the present invention. Referring to FIG. 1, input part 1 is used for inputting a semiconductor process parameter (first process parameter) to be used in a manufacturing method of a semiconductor device, and operating the semiconductor process parameter determining apparatus; display part 2 is used for confirming the semiconductor process parameter (first process parameter and second process parameter) and displaying the simulation result (the second process parameter and circuit performance); library information recording part 3 records a cell library (library information); simulation result recording part 4 records the simulation result; and controlling part 5 comprises a central processing unit (CPU) and a memory, and controls input part 1, display part 2, library information recording part 3, and simulation result recording part 4. The semiconductor process parameter determining apparatus shown in FIG. 1 is actualized by a computer such as, for instance, workstation.

Figure 2:
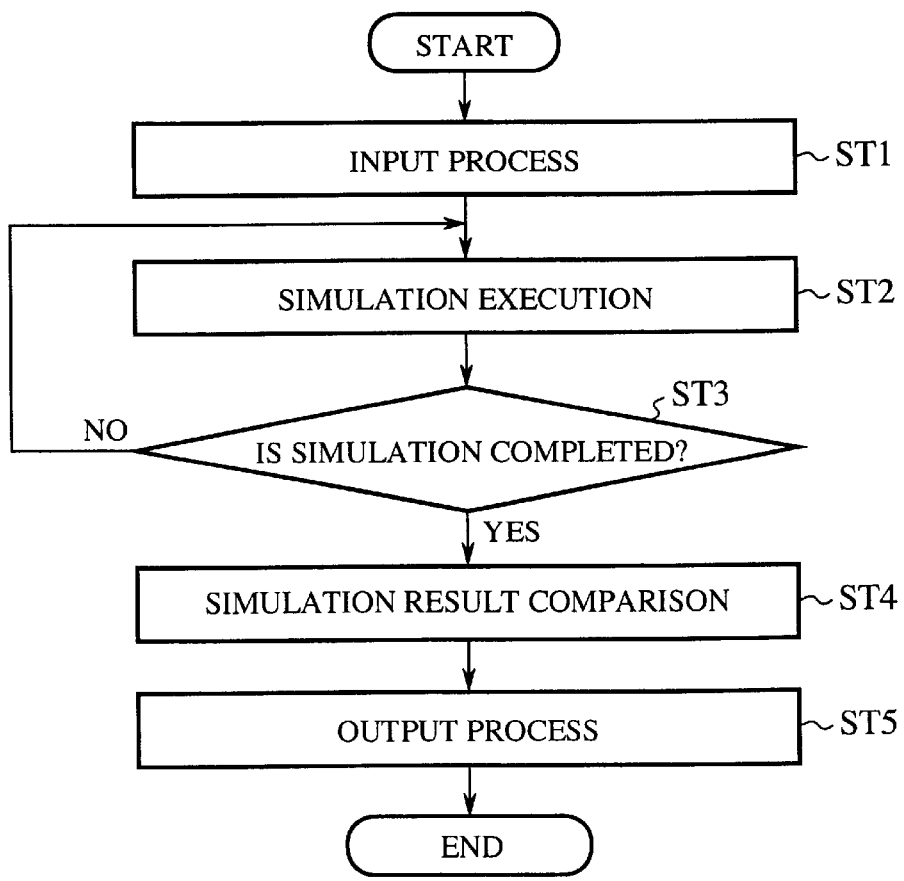
FIG. 2 is a flow chart showing the semiconductor process parameter determining method according to Embodiment 1 of the present invention.

FIG. 2 is a flow chart showing the semiconductor process parameter determining method according to Embodiment 1 of the present invention. FIG. 3 is an explanatory diagram showing the input parameter (the first process parameter) and the output parameter (the second process parameter) in the semiconductor process parameter according to Embodiment 1 of the present invention.

Note that the input parameter may include a tolerance as described later.

The operation will next be described.

First of all, in Step ST1, the input process of the semiconductor process parameter is done from input part 1. As shown in FIG. 3, the input parameter in the semiconductor process parameter according to Embodiment 1 contains a gate scale, an in-the-same-layer wiring adjacent probability, a between-different-layers wiring overlapping probability, the number of wiring layer, and a cell library. The gate scale is the number of gates existing within one cell; the in-the-same-layer wiring adjacent probability is a probability that wirings existing within the same layer are arranged more closely than a predetermined interval; the between-different-layers wiring overlapping probability is a probability that a wiring existing in a certain layer and another wiring existing in a lower or upper layer are arranged in overlapping relation; the number of wiring layer is the number of wiring layers existing in the cell; and the cell library is design information on an inverter or a buffer constructed based on a transistor that underwent optimization such as a transistor used in a process rule, and information on delay time and cross talk noise. Incidentally, in the input process, an interval and the maximum running time of the simulation when the process parameter is changed are occasionally input.

Then, in Step ST2, the simulation is performed by use of the input parameter input from input part 1. In the simulation according to Embodiment 1, the delay time of a certain test circuit (circuit performance) is obtained by means of simulation on the gate level (cell level) by letting the wiring width and the wire spacing of each wiring layer be variables. In a concrete example, the gate scale and the number of wiring layers are converted into a wiring length, and the wiring length is converted into a wiring capacity, or the wiring length is converted into a wiring resistance, by using the in-the-same-layer wiring adjacent probability and the between-different-layers wiring overlapping probability. Incidentally, when the gate scale, the in-the-same-layer wiring adjacent probability, and the between-different-layers wiring overlapping probability are not input for all the wiring layers, the wiring length may be simply converted into the wiring capacity, or the wiring capacity and the wiring resistance may be previously input in the input process of Step ST1. Moreover, the gate scale, the in-the-same-layer wiring adjacent probability, and the between-different-layers wiring overlapping probability are allowed to have been previously recorded in library information recording part 3 as information contained in the cell library. In addition, the result of the simulation performed by letting the wiring width and the wire spacing of each wiring layer be variables is recorded in simulation result recording part 4.

Subsequently, in Step ST3, whether or not the simulation is completed is determined. When the simulation is completed, control proceeds to Step ST4, and when the simulation has not completed, control returns to Step ST2. The conditions for the simulation completion include: the case all the combinations of the wiring width and the wire spacing of each wiring layer have been simulated; the case a certain tendency could be confirmed; the case the simulation of process parameters coming later than a certain value has become unnecessary; the case the user forcefully terminated the simulation; and the case the maximum execution time set in the input process has passed.

Then, in Step ST4, the simulation results recorded in simulation result recording part 4 are compared, and the simulation result in which the delay time is the shortest is extracted. Subsequently, in Step ST5, the wiring width and the wire spacing of each wiring layer giving the shortest delay time are shown in display part 2 as the output parameters shown in FIG. 3. Incidentally, the comparison of the simulation results may be performed and output in display part 2 every the predetermined number of times of simulation, and also every simulation.

As described above, the semiconductor process parameter determining method according to Embodiment 1 has the steps of: inputting an input parameter from input part 1; obtaining the delay time of a certain test circuit by means of simulation on a gate level by letting the output parameter of each wiring layer be a variable; determining whether or not the simulation is completed; extracting the output parameter of each wiring layer giving the shortest delay time; and outputting the extracted output parameter of each wiring layer in display part 2.

Moreover, the semiconductor process parameter determining method of according to Embodiment 1 may be actualized as a semiconductor process parameter determining program that can be performed by computer.

That is, the semiconductor process parameter determining program that can perform by computer the semiconductor process parameter determining method according to Embodiment 1 has the steps of: inputting the input parameter from input part 1; obtaining the delay time of a certain test circuit by means of simulation on a gate level by letting the output parameter of each wiring layer as a variable; determining whether or not the simulation is completed; extracting the output parameter of each wiring layer giving the shortest delay time; and outputting the extracted output parameter of each the wiring layer in display part 2.

As mentioned above, according to Embodiment 1, since the delay time is obtained by means of simulation by using a gate scale, an in-the-same-layer wiring adjacent probability, a between-different-layers wiring overlapping probability, the number of wiring-layer, and a cell library as an input parameter, the effect that the optimum wiring width and wire spacing of each wiring layer can be easily and promptly determined, and at the same time the development cost and development time can be reduced is obtained.

Embodiment 2

Since the semiconductor process parameter determining apparatus used for executing the semiconductor process parameter determining method according to Embodiment 2 of the present invention has the same configuration as that of the semiconductor process parameter determining apparatus according to Embodiment 1 shown in FIG. 1, the explanation is omitted. However, the semiconductor process parameter determining apparatus according to Embodiment 2 comprises a library information recording part that is different from the library information recording part marked with a numeral 3 shown in FIG. 1 in that not a cell library but a transistor library (library information) is recorded therein.

FIG. 4 is an explanatory diagram showing the input parameter (a first process parameter) and the output parameter in the semiconductor process parameter according to Embodiment 2 of the present invention. In FIG. 4, the input parameter is different from the one in Embodiment 1 shown in FIG. 3 in that not a cell library but a transistor library is used as the input parameter.

The operation will next be described.

Since the semiconductor process parameter determining method according to Embodiment 2 of the present invention is the same as the one according to Embodiment 1 shown in FIG. 2, the explanation is omitted. However, in Step ST1, not a cell library but a transistor library is used as an input parameter in the semiconductor process parameter that is input-processed. Furthermore, also in the execution of simulation in Step ST2, the simulation on the transistor level which reflects the transistor library is executed.

Incidentally, the transistor library is information on the gate length, the gate width of the gate and the field area around the gate in a transistor, and for instance, SPICE information corresponds to this library.

As described above, the semiconductor process parameter determining method according to Embodiment 2 has the steps of: inputting an input parameter from input part 1; obtaining the delay time of a certain test circuit by means of simulation on a transistor level by letting an output parameter of each wiring layer be a variable; determining whether or not the simulation is completed; extracting the output parameter of each wiring layer giving the shortest delay time; and outputting the extracted output parameter of each wiring layer in display part 2.

Moreover, the semiconductor process parameter determining method according to Embodiment 2 may be actualized as a semiconductor process parameter determining program that can be performed by computer.

That is, the semiconductor process parameter determining program that can perform by computer the semiconductor process parameter determining method according to Embodiment 2 has the steps of: inputting an input parameter from input part 1; obtaining the delay time of a certain test circuit by means of simulation on a transistor level by letting an output parameter of each wiring layer be a variable; determining whether or not the simulation is completed; extracting the output parameter of each wiring layer giving the shortest delay time; and outputting the extracted output parameter of each wiring layer in display part 2.

As mentioned above, according to Embodiment 2, since the delay time is obtained by means of simulation by using a gate scale, an in-the-same-layer wiring adjacent probability, a between-different-layers wiring overlapping probability, the number of wiring layer, and a transistor library as an input parameter, the effect that the optimum wiring width and wire spacing of each wiring layer can be easily and promptly determined, and at the same time the development cost and development time can be reduced is obtained.

Embodiment 3

Since the semiconductor process parameter determining apparatus used for executing the semiconductor process parameter determining method according to Embodiment 3 of the present invention has the same configuration as that of the semiconductor process parameter determining apparatus of according to Embodiment 1 shown in FIG. 1, the explanation is omitted. FIG. 5 is an explanatory diagram showing the input parameter and the output parameter (a second process parameter) in the semiconductor process parameter according to Embodiment 3 of the present invention. In FIG. 5, the output parameter is different from the one in Embodiment 1 shown in FIG. 3 in that "conductor thickness" is added to the output parameter.

The operation will next be described.

Since the semiconductor process parameter determining method according to Embodiment 3 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by using a wiring width, a wire spacing, and a conductor thickness of each wiring layer as a variable, and in the output process in Step ST5, the wiring width, the wire spacing, and the conductor thickness of each wiring layer are shown in display part 2.

As mentioned above, according to Embodiment 3, since the delay time is obtained by means of simulation by using a gate scale, an in-the-same-layer wiring adjacent probability, a between-different-layers wiring overlapping probability, the number of wiring layer, and a cell library as an input parameter, the effect that the optimum wiring width and wire spacing of each wiring layer can be easily and promptly determined, and at the same time the development cost and development time can be reduced is obtained.

Incidentally, in Embodiment 3, it is described that the library recorded in library information recording part 3 is a cell library. However, the library recorded in library information recording part 3 is not limited to this. When a simulation on a transistor level is executed by use of a transistor library, the similar effect to the one described above is also obtained.

Embodiment 4

Since the semiconductor process parameter determining apparatus used for executing the semiconductor process parameter determining method according to Embodiment 4 of the present invention has the same configuration as that of the semiconductor process parameter determining apparatus according to Embodiment 1 shown in FIG. 1, the explanation is omitted. FIG. 6 is an explanatory diagram showing the input parameter and the output parameter (a second process parameter) in the semiconductor process parameter according to Embodiment 4 of the present invention. In FIG. 6, the output parameter is different from the one in Embodiment 3 shown in FIG. 5 in that "the film thickness of dielectric" and "the relative dielectric constant of dielectric" are added to the output parameter.

The operation will next be described.

Since the semiconductor process parameter determining method according to Embodiment 4 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by using a wiring width, a wire spacing, and a conductor thickness of each wiring layer, and a relative dielectric constant and a film thickness of each dielectric as a variable, and in the output process in Step ST5, the wiring width, wire spacing and conductor thickness of each wiring layer, and the relative dielectric constant and film thickness of each dielectric are displayed in display part 2. Incidentally, the relative dielectric constant and the film thickness of each dielectric are occasionally output as a file, and a database thereon is occasionally constructed.

As mentioned above, according to Embodiment 4, since the delay time is obtained by means of simulation by using a gate scale, an in-the-same-layer wiring adjacent probability, a between-different-layers wiring overlapping probability, the number of wiring layer, and a cell library as an input parameter, the effect that the optimum wiring width, wire spacing, and conductor thickness of each wiring layer, and the optimum relative dielectric constant and film thickness of each dielectric can be easily and promptly determined, and at the same time the development cost and development time can be reduced is obtained.

Incidentally, in Embodiment 4, it is described that the library recorded in library information recording part 3 is a cell library. However, the library recorded in library information recording part 3 is not limited to this. When a simulation on a transistor level is executed by use of a transistor library, the similar effect to the one described above is also obtained.

Embodiment 5

Since the semiconductor process parameter determining apparatus used for executing the semiconductor process parameter determining method of according to Embodiment 5 of the present invention has the same configuration as that of the semiconductor process parameter determining apparatus according to Embodiment 1 shown in FIG. 1, the explanation is omitted. FIG. 7 is an explanatory diagram showing the input parameter (a first process parameter) and the output parameter (a second process parameter) in the semiconductor process parameter according to Embodiment 5 of the present invention. In FIG. 7, the input parameter is different from the one in Embodiment 4 shown in FIG. 6 in that "a plurality of wiring materials" is added to the input parameter, and further the output parameter is different from the one in Embodiment 4 shown in FIG. 6 in that "the optimum wiring material" is added to the output parameter.

The operation will next be described.

Since the semiconductor process parameter determining method according to Embodiment 5 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by using a wiring width, a wire spacing, and a conductor thickness of each wiring layer, and a relative dielectric constant and a film thickness of each dielectric, and each wiring material that is the input parameter as a variable, and in the output process in Step ST5, the wiring width, the wire spacing, and the conductor thickness of each wiring layer, the relative dielectric constant and the film thickness of each dielectric, and the optimum wiring material are displayed in display part 2. Incidentally, the relative dielectric constant and the film thickness of each dielectric are occasionally output as a file, and a database thereon is occasionally constructed.

As mentioned above, according to Embodiment 5, since the delay time is obtained by means of simulation by using a gate scale, an in-the-same-layer wiring adjacent probability, a between-different-layers wiring overlapping probability, the number of wiring layer, a cell library, and a plurality of wiring materials as an input parameter, the effect that the optimum wiring width, wire spacing, and conductor thickness of each wiring layer, and the optimum relative dielectric constant and film thickness of each dielectric, and the optimum wiring material can be easily and promptly determined, and at the same time the development cost and development time can be reduced is obtained.

Incidentally, in Embodiment 5, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 6

Since the semiconductor process parameter determining apparatus used for executing the semiconductor process parameter determining method of according to Embodiment 6 of the present invention has the same configuration as that of the semiconductor process parameter determining apparatus according to Embodiment 1 shown in FIG. 1, the explanation is omitted. FIG. 8 is an explanatory diagram showing the input parameter (a first process parameter) and the output parameter (a second process parameter) in the semiconductor process parameter according to Embodiment 6 of the present invention. In FIG. 8, the input parameter is different from the one in Embodiment 5 shown in FIG. 7 in that "a plurality of via materials" is added to the input parameter, and further the output parameter is different from the one in Embodiment 5 shown in FIG. 7 in that "via diameter," "via shape," and "the optimum via material" are added to the output parameter.

The operation will next be described.

Since the semiconductor process parameter determining method according to Embodiment 6 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by using a wiring width, a wire spacing, and a conductor thickness of each wiring layer, a relative dielectric constant and a film thickness of each dielectric, a plurality of wiring materials, and a plurality of via materials as a variable, and in the output process in Step ST5, the wiring width, wire spacing, and conductor thickness of each wiring layer, the relative dielectric constant and film thickness of each dielectric, the optimum wiring material, the via diameter, the via shape, and the optimum via material are displayed in display part 2. Incidentally, the relative dielectric constant and film thickness of each dielectric, the via shape, and the via material are occasionally output as a file, and a database thereon is occasionally constructed.

As mentioned above, according to Embodiment 6, since the delay time is obtained by means of simulation by using a gate scale, an in-the-same-layer wiring adjacent probability, a between-different-layers wiring overlapping probability, the number of wiring layer, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, and the optimum via material can be easily and promptly determined, and at the same time the development cost and development time can be reduced is obtained.

Incidentally, in Embodiment 6, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 7

Since the semiconductor process parameter determining apparatus used for executing the semiconductor process parameter determining method of according to Embodiment 7 of the present invention has the same configuration as that of the semiconductor process parameter determining apparatus according to Embodiment 1 shown in FIG. 1, the explanation is omitted. FIG. 9 is an explanatory diagram showing the input parameter and the output parameter in the semiconductor process parameter according to Embodiment 7 of the present invention. In FIG. 9, the input parameter is different from the one in Embodiment 6 shown in FIG. 8 in that "operation frequency (tolerance)" is added to the input parameter.

The operation will next be described.

Since the semiconductor process parameter determining method according to Embodiment 7 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by letting the input operation frequency be the restriction and by using a wiring width, a wire spacing, and a conductor thickness of each wiring layer, a relative dielectric constant and a film thickness of each dielectric, a plurality of wiring materials, and a plurality of via materials as a variable, and in the output process in Step ST5, the wiring width, wire spacing, and conductor thickness of each wiring layer, the relative dielectric constant and film thickness of each dielectric, the optimum wiring material, the via diameter, the via shape, and the optimum via material are displayed in display part 2. Incidentally, the relative dielectric constant and film thickness of each dielectric, the via shape, and the via material are occasionally output as a file, and a database thereon is occasionally constructed.

As mentioned above, according to Embodiment 7, since the delay time is obtained by means of simulation by letting the predetermined operation frequency be the restriction and by using a gate scale, an in-the-same-layer wiring adjacent probability, a between-different-layers wiring overlapping probability, the number of wiring layer, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, and the optimum via material can be easily and promptly determined in the predetermined operation frequency, and at the same time the development cost and development time can be reduced is obtained.

Incidentally, in Embodiment 7, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 8

Since the semiconductor process parameter determining apparatus used for executing the semiconductor process parameter determining method of according to Embodiment 8 of the present invention has the same configuration as that of the semiconductor process parameter determining apparatus according to Embodiment 1 shown in FIG. 1, the explanation is omitted. FIG. 10 is an explanatory diagram showing the input parameter and the output parameter in the semiconductor process parameter according to Embodiment 8 of the present invention. In FIG. 10, the input parameter is different from the one in Embodiment 7 shown in FIG. 9 in that "cross talk noise tolerance (tolerance)" is added to the input parameter. Incidentally, the cross talk noise tolerance is a signal voltage change tolerance induced by the cross talk noise.

The operation will next be described.

Since the semiconductor process parameter determining method according to Embodiment 8 of the present invention is the same as the semiconductor process parameter determining method according to Embodiment 1 shown in FIG. 2, the explanation is omitted. However, in the execution of simulation instep ST2, the delay time of a certain test circuit is obtained by means of simulation on a gate level by letting the input operation frequency and cross talk noise tolerance be the restrictions and by using a wiring width, a wire spacing, and a conductor thickness of each wiring layer, a relative dielectric constant and a film thickness of each dielectric, a plurality of wiring materials, and a plurality of via materials as a variable, and in the output process in Step ST5, the wiring width, wire spacing, and conductor thickness of each wiring layer, the relative dielectric constant and film thickness of each dielectric, the optimum wiring material, the via diameter, the via shape, and the optimum via material are displayed in display part 2. Incidentally, the relative dielectric constant and film thickness of each dielectric, the via shape, and the via material are occasionally output as a file, and a database thereon is occasionally constructed.

As mentioned above, according to Embodiment 8, since the delay time is obtained by means of simulation by letting the predetermined operation frequency and cross talk noise tolerance be the restrictions and by using a gate scale, an in-the-same-layer wiring adjacent probability, a between-different-layers wiring overlapping probability, the number of wiring layer, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, and the optimum via material that satisfy the predetermined operation frequency and cross talk noise tolerance can be easily and promptly determined, and at the same time the development cost and development time can be reduced is obtained.

Incidentally, in Embodiment 8, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 9

Since the semiconductor process parameter determining apparatus used for executing the semiconductor process parameter determining method of according to Embodiment 9 of the present invention has the same configuration as that of the semiconductor process parameter determining apparatus according to Embodiment 1 shown in FIG. 1, the explanation is omitted. FIG. 11 is an explanatory diagram showing the input parameter and the output parameter in the semiconductor process parameter according to Embodiment 9 of the present invention. In FIG. 11, the input parameter is different from the one in Embodiment 8 shown in FIG. 10 in that "power consumption tolerance (tolerance)" and "transition delay tolerance (tolerance)" are added to the input parameter. The power consumption tolerance is the upper limit of the power consumption in the operation of a semiconductor device, and the transition delay tolerance is the upper limit of the time required when the signal changes.

The operation will next be described.

Since the semiconductor process parameter determining method according to Embodiment 9 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by letting the input operation frequency, cross talk noise tolerance, power consumption tolerance, and transition delay tolerance be the restrictions and by using a wiring width, a wire spacing, and a conductor thickness of each wiring layer, a relative dielectric constant and a film thickness of each dielectric, a plurality of wiring materials, and a plurality of via materials as a variable, and in the output process in Step ST5, the wiring width, wire spacing, and conductor thickness of each wiring layer, the relative dielectric constant and film thickness of each dielectric, the optimum wiring material, the via diameter, the via shape, and the optimum via material are displayed in display part 2. Incidentally, the relative dielectric constant and film thickness of each dielectric, the via shape, and the via material are occasionally output as a file, and a database thereon is occasionally constructed.

As mentioned above, according to Embodiment 9, since the delay time is obtained by means of simulation by letting the predetermined operation frequency, cross talk noise tolerance, power consumption tolerance, and transition delay tolerance be the restrictions and by using a gate scale, an in-the-same-layer wiring adjacent probability, a between-different-layers wiring overlapping probability, the number of wiring layer, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, and the optimum via material that satisfy all the predetermined operation frequency, cross talk noise tolerance, power consumption tolerance, and transition delay tolerance can be easily and promptly determined, and at the same time the development cost and development time can be reduced is obtained.

Incidentally, in Embodiment 9, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 10

Since the semiconductor process parameter determining apparatus used for executing the semiconductor process parameter determining method of according to Embodiment 10 of the present invention has the same configuration as that of the semiconductor process parameter determining apparatus according to Embodiment 1 shown in FIG. 1, the explanation is omitted. FIG. 12 is an explanatory diagram showing the input parameter and the output parameter in the semiconductor process parameter according to Embodiment 10 of the present invention. In FIG. 12, the input parameter is different from the one in Embodiment 9 shown in FIG. 11 in that "the maximum allowable number of wire layer (tolerance)" instead of "the number of wire layer" is added to the input parameter. The output parameter is different from the one in Embodiment 9 shown in FIG. 11 in that "the optimum number of wiring layer" is added to the output parameter (the second process parameter).

The operation will next be described.

Since the semiconductor process parameter determining method according to Embodiment 10 of the present invention is the same as the semiconductor process parameter determining method according to Embodiment 1 shown in FIG. 2, the explanation is omitted. However, in the execution of simulation in Step ST2, the delay time of a certain test circuit is obtained by means of simulation on a gate level by letting the input operation frequency, cross talk noise tolerance, power consumption tolerance, and transition delay tolerance be the restrictions and by using a wiring width, a wire spacing, and a conductor thickness of each wiring layer, a relative dielectric constant and a film thickness of each dielectric, a plurality of wiring materials, a plurality of via materials, and a plurality of numbers of wiring layer as a variable, and in the output process in Step ST5, the wiring width, wire spacing, and conductor thickness of each wiring layer, the relative dielectric constant and film thickness of each dielectric, the optimum wiring material, the via diameter, the via shape, the optimum via material, and the optimum number of wiring layer are displayed in display part 2. Incidentally, the relative dielectric constant and film thickness of each dielectric, the via shape, and the via material are occasionally output as a file, and a database thereon is occasionally constructed.

As mentioned above, according to Embodiment 10, since the delay time is obtained by means of simulation by letting the predetermined operation frequency, cross talk noise tolerance, power consumption tolerance, transition delay tolerance, and the maximum allowable number of wiring layer be the restrictions and by using a gate scale, an in-the-same-layer wiring adjacent probability, a between-different-layers wiring overlapping probability, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, the optimum via material, and the optimum number of wiring layer that satisfy all the predetermined operation frequency, the cross talk noise tolerance, the power consumption tolerance, the transition delay tolerance, and the maximum allowable number of wiring layer can be easily and promptly determined, and at the same time the development cost and development time can be reduced is obtained.

Incidentally, in Embodiment 10, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 11

Figure 13:
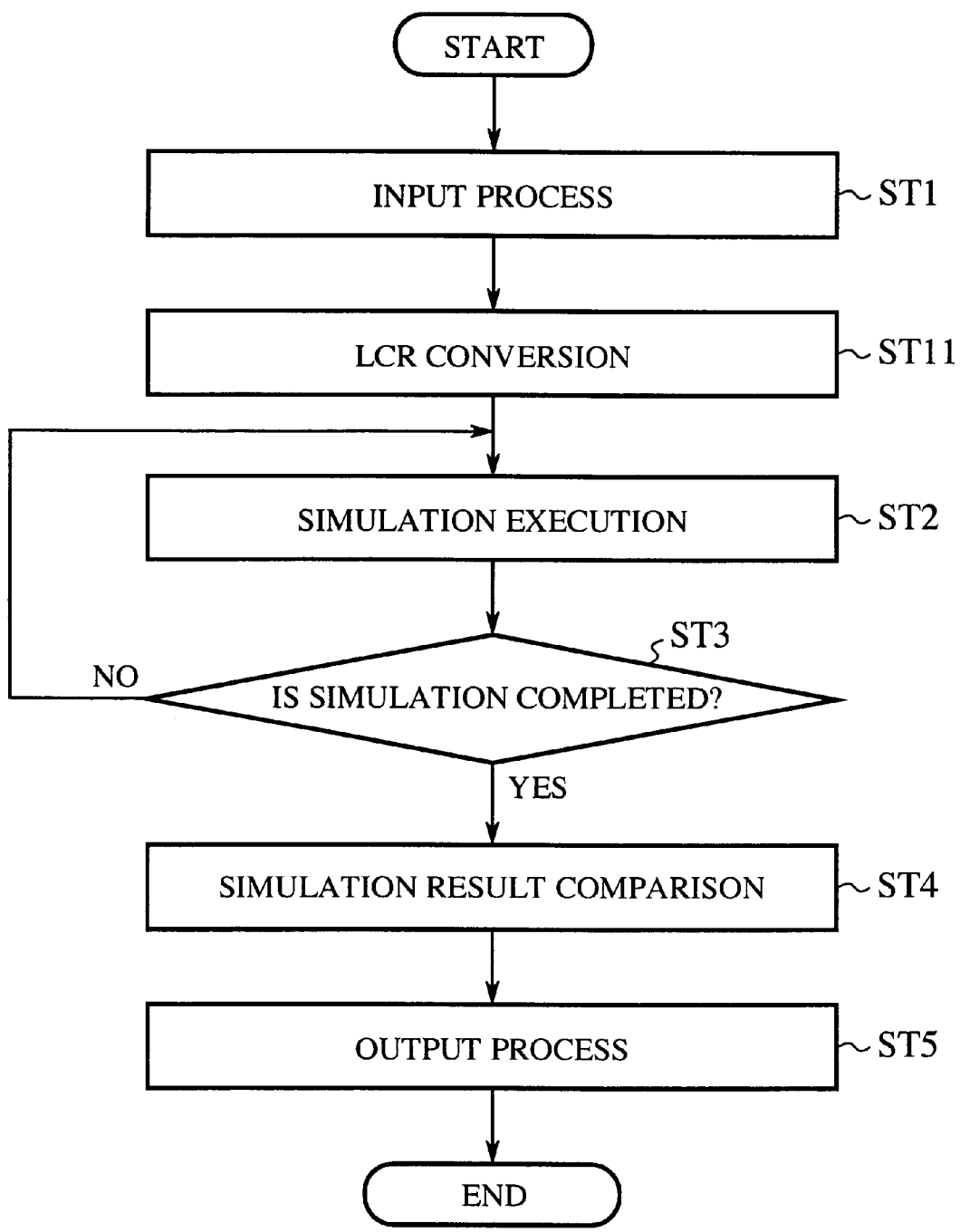
FIG. 13 is a flow chart showing the semiconductor process parameter determining method according to Embodiment 11 of the present invention.

Since the semiconductor process parameter determining apparatus used for executing the semiconductor process parameter determining method of according to Embodiment 11 of the present invention has the same configuration as that of the semiconductor process parameter determining apparatus according to Embodiment 1 shown in FIG. 1, the explanation is omitted. FIG. 13 is a flow chart showing the semiconductor process parameter determining method according to Embodiment 11 of the present invention. FIG. 14 is an explanatory diagram showing the input parameter and the output parameter in the semiconductor process parameter according to Embodiment 11 of the present invention. In FIG. 14, the input parameter is different from the one in Embodiment 10 shown in FIG. 12 in that the input parameters, operation frequency, cross talk noise tolerance, power consumption tolerance, and transition delay tolerance are converted into LCR (inductance/capacitance/resistance).

The operation will next be described.

The semiconductor process parameter determining method according to Embodiment 11 shown in FIG. 13 corresponds to the method in which Step ST11 is inserted between Step ST1 and Step ST2 in the semiconductor process parameter determining method according to Embodiment 1 shown in FIG. 2. Accordingly, only the operation that is different from that of the semiconductor process parameter determining method according to Embodiment 1 will be described.

A LCR conversion is done in Step ST11. The LCR conversion is performed as follows: for instance, for the operation frequency, calculated is a capacitance with which control comes to be late for the clock cycle even if the driving is carried out in a cell having the maximum driving ability, by assuming that a combinational circuit between sequential circuits has X steps. For the cross talk noise tolerance, calculated is an allowable capacitance between adjacent lines when a wiring driven in a cell having the maximum driving ability influences a wiring driven in a cell having the minimum driving ability. These calculated capacitances are compared, to thereby determine the most stringent tolerance for the allowable capacitance.

Since the operations following Step ST2 are the same as the one in the semiconductor process parameter determining method according to Embodiment 1 shown in FIG. 2, the explanation is omitted. However, in the execution of simulation instep ST2, the delay time of a certain test circuit is obtained by means of simulation on a gate level by letting the LCR-converted capacitance tolerance, etc. be the restrictions and by using a wiring width, a wire spacing, and a conductor thickness of each wiring layer, a relative dielectric constant and a film thickness of each dielectric, a plurality of wiring materials, a plurality of via materials, and a plurality of numbers of wiring layer as a variable, and in the output process in Step ST5, the wiring width, wire spacing, and conductor thickness of each wiring layer, the relative dielectric constant and film thickness of each dielectric, the optimum wiring material, the via diameter, the via shape, the optimum via material, and the optimum number of wiring layer are displayed in display part 2. Incidentally, the relative dielectric constant and film thickness of each dielectric, the via shape, and the via material are occasionally output as a file, and a database thereon is occasionally constructed.

As described above, the semiconductor process parameter determining method according to Embodiment 11 has the steps of: inputting the input parameter from input part 1; converting into LCR, the operation frequency, the cross talk noise tolerance, the power consumption tolerance, and the transition delay; obtaining the delay time of a certain test circuit by means of simulation on a transistor level by using the output parameters of each wiring layer as a variable; determining whether or not the simulation is completed; extracting the output parameter of each wiring layer giving the shortest delay time; and outputting the extracted output parameter of each wiring layer in display part 2.

Moreover, the semiconductor process parameter determining method according to Embodiment 11 may be actualized as a semiconductor process parameter determining program that can be performed by computer.

That is, the semiconductor process parameter determining program that can perform by computer the semiconductor process parameter determining method according to Embodiment 11 has the steps of: inputting an input parameter from input part 1; converting into LCR, the operation frequency, cross talk noise tolerance, power consumption tolerance, and transition delay; obtaining the delay time of a certain test circuit by means of simulation on a transistor level by using the output parameters of each wiring layer as a variable; determining whether or not the simulation is completed; extracting the output parameter of each wiring layer giving the shortest delay time; and outputting the extracted output parameter of each wiring layer in display part 2.

As mentioned above, according to Embodiment 11, since the delay time is obtained by means of simulation by letting the maximum allowable number of wiring layer and the LCR-converted capacitance tolerance, etc. be the restrictions and by using a gate scale, an in-the-same-layer wiring adjacent probability, a between-different-layers wiring overlapping probability, a cell library, a plurality of wiring materials, and a plurality of via materials as an input parameter, the effect that the optimum wiring width, wire spacing, and conductor thickness of each wiring layer, the optimum relative dielectric constant and film thickness of each dielectric, the optimum wiring material, the via diameter, the via shape, the optimum via material, and the optimum number of wiring layer that satisfy the maximum allowable number of wiring layer and the LCR-converted capacitance tolerance, etc. can be easily and promptly determined, and at the same time the development cost and development time can be reduced is obtained.

Incidentally, in Embodiment 11, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 12

Figure 15:
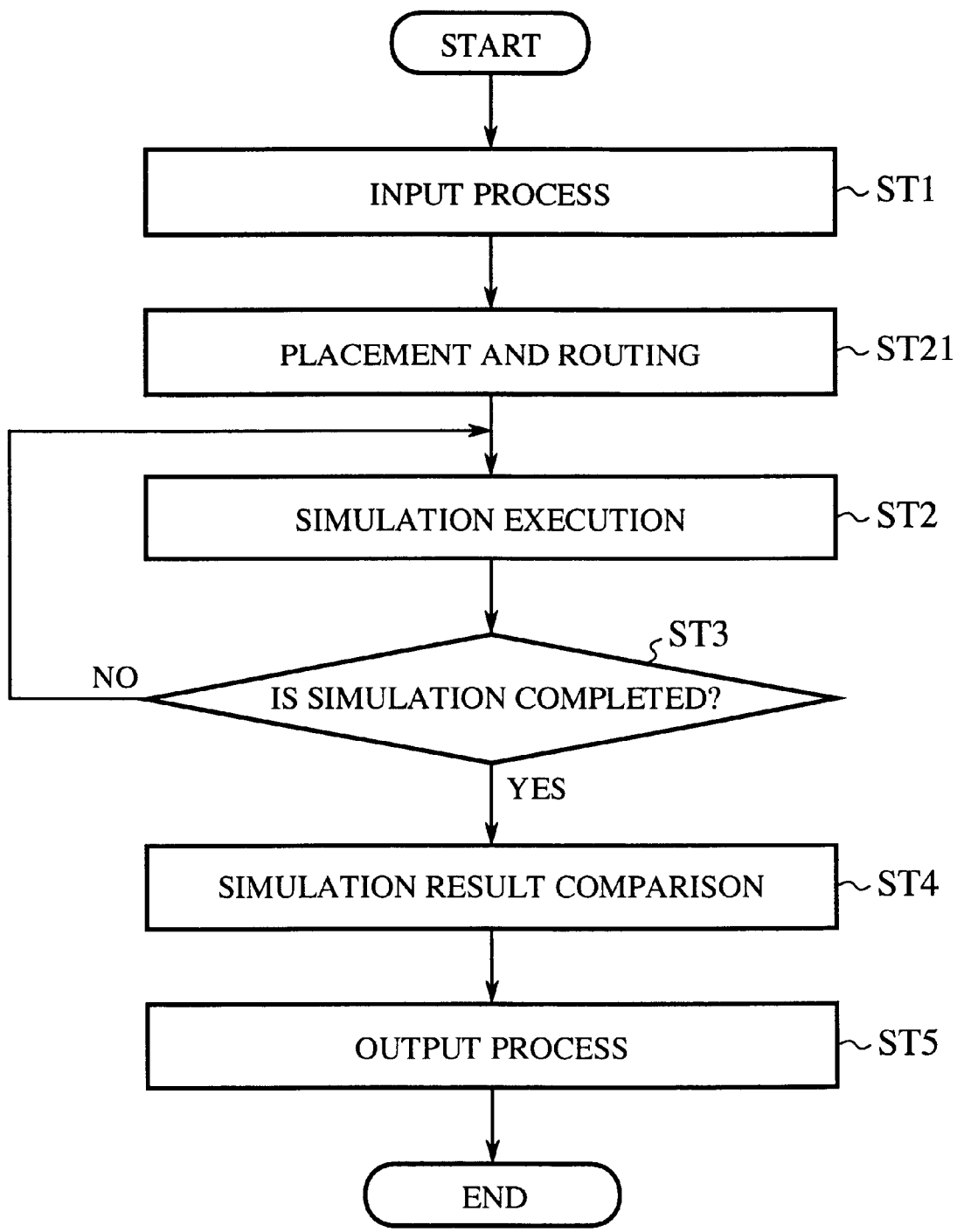
FIG. 15 is a flow chart showing the semiconductor process parameter determining method according to Embodiment 12 of the present invention.

Since the semiconductor process parameter determining apparatus used for executing the semiconductor process parameter determining method of according to Embodiment 12 of the present invention has the same configuration as that of the semiconductor process parameter determining apparatus according to Embodiment 1 shown in FIG. 1, the explanation is omitted. FIG. 15 is a flow chart showing the semiconductor process parameter determining method according to Embodiment 12 of the present invention.

FIG. 16 is an explanatory diagram showing the input parameter and the output parameter in the semiconductor process parameter according to Embodiment 12 of the present invention. In FIG. 16, the input parameters (the first process parameters) are floorplan information showing a netlist, a die size, and the location of pad, the maximum allowable number of wiring layer, a cell library, an operation frequency, a cross talk noise tolerance, a power consumption tolerance, and a transition delay tolerance. The netlist is logic interconnection information; the die size is the layout size; and the floorplan information corresponds to the initial value upon performing the placement and routing. The output parameters are the same as the ones in Embodiment 11 shown in FIG. 14.

The operation will next be described.

The semiconductor process parameter determining method according to Embodiment 12 shown in FIG. 15 corresponds to the method in which Step ST21 is inserted between Step ST1 and Step ST2 in the semiconductor process parameter determining method according to Embodiment 1 shown in FIG. 2. Accordingly, only the operation that is different from that of the semiconductor process parameter determining method according to Embodiment 1 will be described.

In Step ST21, the placement and routing is done. The placement and routing is to perform layout tasks based on design information. First of all, the floor information such as the die size, etc., and the netlist are format-converted for the tool of the placement and routing. Subsequently, the placement and routing is done based on the restrictions such as the operation frequency, cross talk noise tolerance, power consumption tolerance, and transition delay tolerance, etc.

Since the operations following Step ST2 are the same as the one in the semiconductor process parameter determining method according to Embodiment 1 shown in FIG. 2, the explanation is omitted. However, in the execution of simulation in Step ST2, the delay time of the input netlist is obtained by means of simulation on a gate level by letting the input operation frequency, cross talk noise tolerance, power consumption tolerance, and transition delay tolerance be the restrictions and by using a wiring width, a wire spacing, and a conductor thickness of each wiring layer, a relative dielectric constant and a film thickness of each dielectric, a plurality of wiring materials, a plurality of via materials, and a plurality of numbers of wiring layer as a variable, and in the output process in Step ST5, the wiring width, wire spacing, and conductor thickness of each wiring layer, the relative dielectric constant and film thickness of each dielectric, the optimum wiring material, the via diameter, the via shape, the optimum via material, and the optimum number of wiring layer are displayed in display part 2. Incidentally, the relative dielectric constant and film thickness of each dielectric, the via shape, and the via material are occasionally output as a file, and a database thereon is occasionally constructed.

As described above, the semiconductor process parameter determining method according to Embodiment 12 has the steps of: inputting the input parameter from input part 1; format-converting the floorplan information and the netlist for the tool of the placement and routing, and performing the placement and routing based on the restrictions such as the operation frequency, cross talk noise tolerance, power consumption tolerance, and transition delay tolerance; obtaining the delay time of the input netlist by means of simulation on a gate level by using the output parameters of each wiring layer as a variable; determining whether or not the simulation is completed; extracting the output parameter of each wiring layer giving the shortest delay time; and outputting the extracted output parameter of each wiring layer in display part 2.

Moreover, the semiconductor process parameter determining method according to Embodiment 12 may be actualized as a semiconductor process parameter determining program that can be performed by computer.

That is, the semiconductor process parameter determining program that can perform by computer the semiconductor process parameter determining method according to Embodiment 12 has the steps of: inputting the input parameter from input part 1; format-converting the floorplan information and the netlist for the tool of the placement and routing, and performing the placement and routing based on the restrictions such as the operation frequency, cross talk noise tolerance, power consumption tolerance, and transition delay tolerance; obtaining the delay time of the input netlist by means of simulation on a gate level by using the output parameters of each wiring layer as a variable; determining whether or not the simulation is completed; extracting the output parameter of each wiring layer giving the shortest delay time; and outputting the extracted output parameter of each wiring layer in display part 2.

As mentioned above, according to Embodiment 12, since the delay time is obtained by means of simulation by letting the predetermined operation frequency, cross talk noise tolerance, power consumption tolerance, transition delay tolerance, and the maximum allowable number of wiring layer be the restrictions and by using netlist, floorplan information, and cell library as an input parameter, the effect that the optimum wiring width, wire spacing, and conductor thickness of each wiring layer, the optimum relative dielectric constant and film thickness of each dielectric, the optimum wiring material, the via diameter, the via shape, the optimum via material, and the optimum number of wiring layer that satisfy all the predetermined operation frequency, cross talk noise tolerance, power consumption tolerance, transition delay tolerance, and the maximum allowable number of wiring layer can be easily and promptly determined, and at the same time the development cost and development time can be reduced is obtained.

Incidentally, in Embodiment 12, it is described that the library recorded in library information recording part 3 is a cell library. However, the library recorded in library information recording part 3 is not limited to this. When the simulation on a transistor level is executed by use of a transistor library, the similar effect to the one described above is also obtained.

Embodiment 13

Figure 17:
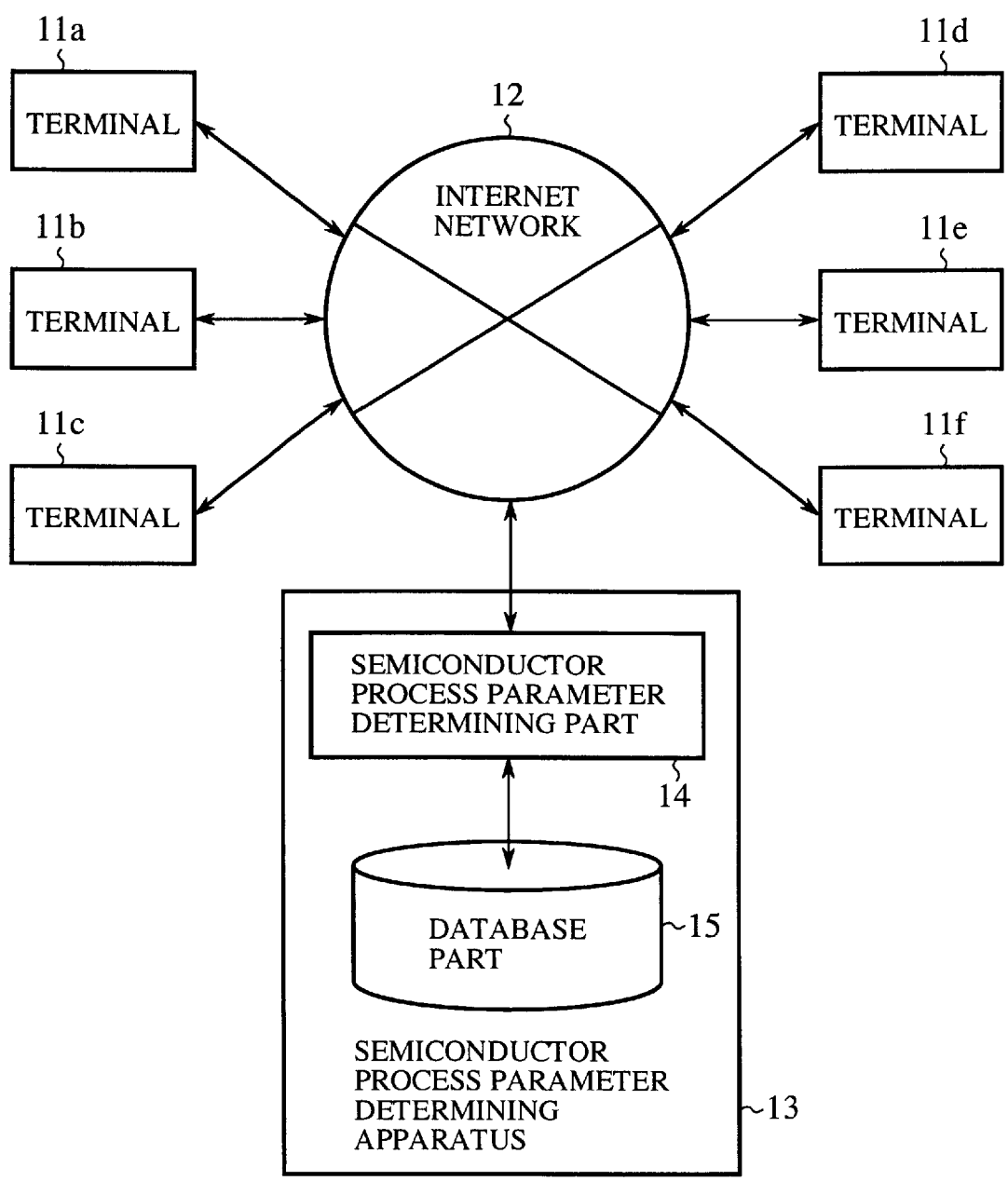
FIG. 17 is a block diagram showing the configuration of the semiconductor process parameter determining system according to Embodiment 13 of the present invention.
Figure 18:
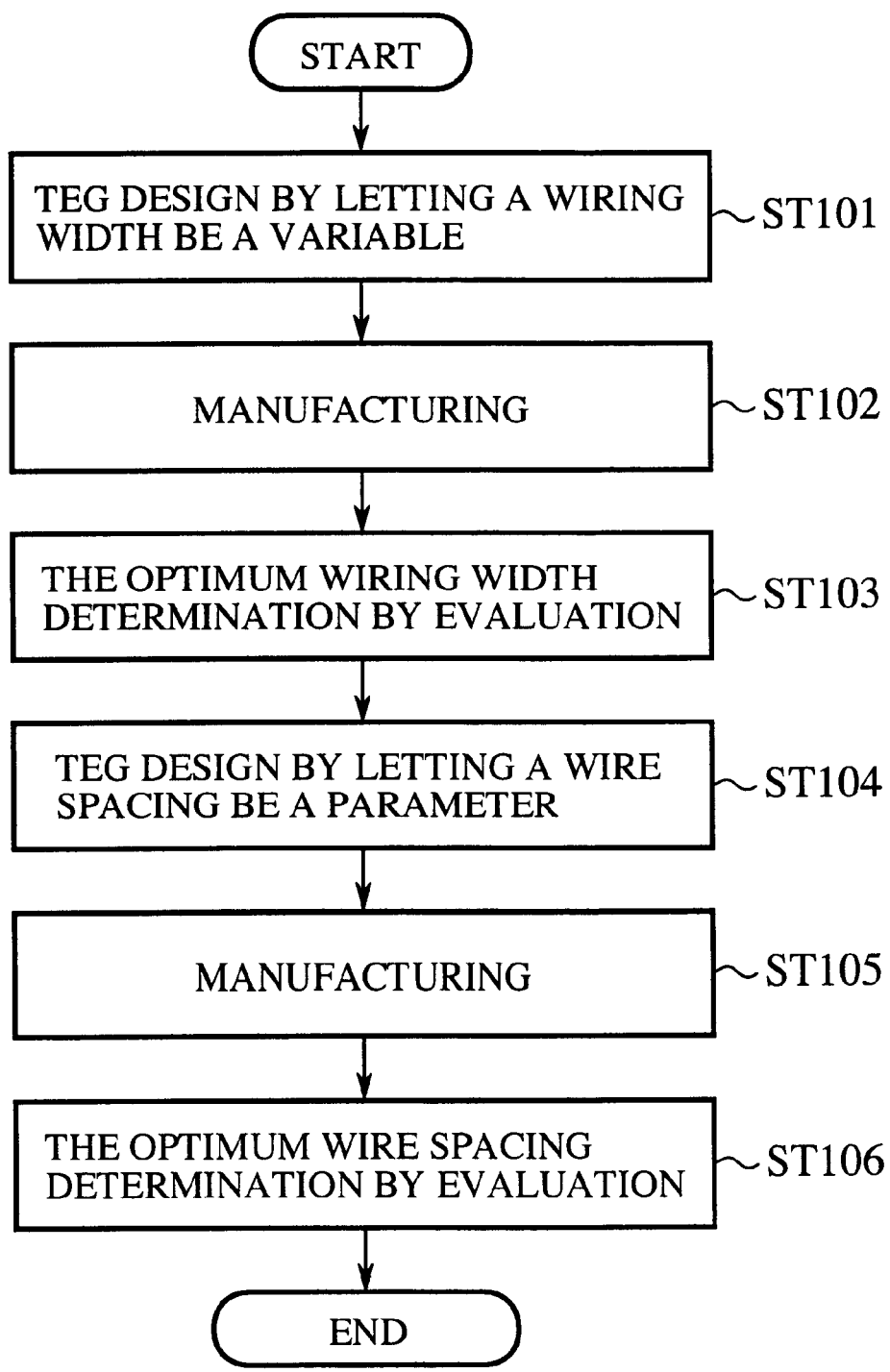
FIG. 18 is a flow chart showing an example of conventional semiconductor process parameter determining methods.

FIG. 17 is a block diagram showing the configuration of the semiconductor process parameter determining system according to Embodiment 13 of the present invention. Referring to FIG. 17, terminals 11a–11f comprise at least input part (input means) 1, display part (output means) 2 shown in FIG. 1, and an internet-capable environment (communication means) not shown. Semiconductor process parameter determining apparatus 13 can communicate with each terminal 11 through internet network (communication line) 12; semiconductor process parameter determining part 14 can execute the semiconductor process parameter determining method; and database part 15 can transmit and receive data with semiconductor process parameter determining part 14.

The operation will next be described.

Each terminal 11 can transmit the input parameter (the first process parameter, tolerance) from input part 1 to semiconductor process parameter determining part 14 through internet network 12 based on the semiconductor process parameter determining method executable by semiconductor process parameter determining part 14. Moreover, each terminal 11 can receive the output parameter (the second process parameter, circuit performance) output by semiconductor process parameter determining part 14 through internet network 12, and display the output parameter in parameter part 2.

Semiconductor process parameter determining part 14 can execute the semiconductor process parameter determining method shown in Embodiments 1–12, and records/controls the simulation result and the connection information of each terminal 11 in data base part 15. In addition, semiconductor process parameter determining apparatus 13 can charge for use according to the use state of each terminal 11. The apparatus can change the charge according to, for instance, the amount and the type of information of the input parameter and the output parameter.

As mentioned above, according to Embodiment 13 since semiconductor process parameter determining apparatus 13 is constructed to provide the environment in which the semiconductor process parameter determining method can be executed from each terminal 11 through internet network 12, the effect that each terminal 11 that is connected through internet network 12 can easily and promptly determine the optimum process parameter and at the same time the development cost and development time can be reduced is obtained.

Additionally, according to Embodiment 13 since the system is constructed to provide on a chargeable basis the environment in which the semiconductor process parameter determining method can be executed from each terminal 11, the effect that the charge can be collected from a great number of terminals 11 and an enterprise can conduct activities as the enterprise providing the semiconductor process parameter determining method is obtained.

As described above, according to the present invention, since the semiconductor process parameter determining method is constructed to comprise the steps of: inputting either or both of a first process parameter and a tolerance as an input parameter; obtaining circuit performance by means of simulation on either or both of a gate level and a transistor level by letting a second process parameter of each wiring layer be a variable; judging whether or not the simulation has completed; extracting the second process parameter of each wiring layer accomplishing the desired circuit performance; and outputting the extracted second process parameter of each the wiring layer, the effect that the optimum second process parameter of each wiring layer can be easily and promptly determined, and at the same time the development cost and development time can be reduced is obtained.

According to the present invention, since the semiconductor process parameter determining system is constructed to comprise: a terminal comprising: an input means for inputting either or both of a first process parameter and a tolerance; an output means for outputting the received second process parameter of each wiring layer; and a communicating means capable of sending and receiving the first process parameter, the tolerance, and the second process parameter through a communication line, and a semiconductor process parameter determining apparatus that obtains circuit performance by performing the simulation based on either or both of the first process parameter and the tolerance received from the terminal device, and sends the second process parameter of each wiring layer accomplishing the desired circuit performance based on the result of the simulation to the terminal device, the effect that the terminal connected through the communication line can easily and promptly determine the optimum second process parameter, and at the same time the development cost and development time can be reduced is obtained.

According to the present invention since the semiconductor process parameter determining apparatus is constructed to charge each terminal according to the amount of information and the type of information that the apparatus transmitted to the terminal and received from the terminal, the effect that the charge can be collected from a great number of the terminals and thereby an enterprise can conduct activities as the enterprise providing the semiconductor process parameter determining method is obtained.

What is claimed is:

1. A semiconductor process parameter determining method to obtain optimum wiring width and wire spacing of each wiring layer, comprising the steps of:
   inputting a first process parameter as an input parameter;
   obtaining a predetermined circuit characteristic by performing a simulation on a gate level and/or a transistor level by use of said input parameter with a second process parameter, of each wiring layer constructing a semiconductor device, as a variable;
   determining whether said simulation is completed or not;
   extracting a parameter having a shortest delay time in said second process parameter for each wiring layer obtaining a desired circuit characteristic; and
   outputting said extracted, second process parameter for each wiring layer, wherein the first process parameter is selected from at least one, or two or more of a gate scale, an in-the-same-layer wiring adjacent probability, a between-different-layers wiring overlapping probability, the number of wiring layer, library information, a plurality of wiring materials, a plurality of via materials, floorplan information, and a netlist.

2. The semiconductor process parameter determining method according to claim 1, wherein said input parameter includes a tolerance, which is selected from at least one, or two or more of an operation frequency, a cross talk noise tolerance, a power consumption tolerance, a transition delay tolerance, and the maximum allowable number of wiring layers.

3. The semiconductor process parameter determining method according to claim 2, further comprising a step of converting the tolerance into any one of inductance, capacitance and resistance.

4. The semiconductor process parameter determining method according to claim 1, wherein when the input parameter includes a tolerance and floorplan information and a netlist, the method comprises a step of format-converting said floorplan information and netlist while executing the placement and routing based on the tolerance.

5. The semiconductor process parameter determining method according to claim 1, wherein the second process parameter is selected from at least one, or two or more of a wiring width, a wire spacing, and a conductor thickness of the wiring layer, a relative dielectric constant and a film thickness of a dielectric, a plurality of wiring materials, a plurality of via materials, and a plurality of numbers of wiring layer.

6. A semiconductor process parameter determining program capable of executing by computer a semiconductor process parameter determining method to obtain optimum wiring width and wire spacing of each wiring layer comprising the steps of:
   inputting a first process parameter and/or a tolerance as an input parameter;
   obtaining a predetermined circuit characteristic by means of simulation on a gate level and/or a transistor level by use of said input parameter with a second process parameter, for each wiring layer constructing a semiconductor devices as a variable;
   determining whether the simulation is completed or not;
   extracting a parameter having a shortest delay time in the second process parameter for each wiring layer accomplishing a desired circuit characteristic; and
   outputting the extracted, second process parameter for each wiring layer, wherein the first process parameter is selected from at least one, or two or more of a gate scale, an in-the-same-layer wiring adjacent probability, a between-different-layers wiring overlapping probability, the number of wiring layer, library information, a plurality of wiring materials, a plurality of via materials, floorplan information, and a netlist.

7. The semiconductor process parameter determining program according to claim 6, wherein the tolerance is selected from at least one, or two or more of an operation frequency, a cross talk noise tolerance, a power consumption tolerance, a transition delay tolerance, the maximum allowable number of wiring layer.

8. The semiconductor process parameter determining program according to claim 6, wherein the second process parameter is selected from at least one, or two or more of a wiring width, a wire spacing, and a conductor thickness of the wiring layer, a relative dielectric constant and a film thickness of a dielectric, a plurality of wiring materials, a plurality of via materials, and a plurality of numbers of wiring layer.

* * * * *